United States Patent [19]

Tsuruta et al.

[11] Patent Number: 5,488,243
[45] Date of Patent: Jan. 30, 1996

[54] SOI MOSFET WITH FLOATING GATE

[75] Inventors: Kazuhiro Tsuruta, Obu; Hiroaki Himi, Nagoya; Akiyoshi Asai, Aichi; Seiji Fujino, Toyota, all of Japan

[73] Assignee: Nippondenso Co., Ltd., Kariya, Japan

[21] Appl. No.: 160,885

[22] Filed: Dec. 3, 1993

[30] Foreign Application Priority Data

Dec. 4, 1992 [JP] Japan ................................. 4-325783
Jun. 2, 1993 [JP] Japan ................................. 5-131864

[51] Int. Cl.$^6$ ................................. H01L 29/78
[52] U.S. Cl. ........................... 257/314; 257/315; 257/347
[58] Field of Search ................. 257/314, 315, 257/347, 321

[56] References Cited

U.S. PATENT DOCUMENTS 4,748,485  5/1988  Vasudev .
4,907,053  3/1990  Ohmi ................................. 257/315

FOREIGN PATENT DOCUMENTS 2708599   9/1977  Germany ................................. 257/314
57-113282  7/1982  Japan ................................. 257/314
58-158973  9/1983  Japan ................................. 257/321
61-78169   4/1986  Japan ................................. 257/347
1307270   12/1989  Japan .
2294076   12/1990  Japan .

OTHER PUBLICATIONS

Sze, *Semiconductor Devices*, pp. 495–497, 1985.
Y. Miyazawa et al, "Bonded SOI with Polish–Stopper Technology for ULSI" IEICE Trans. Electron, vol. E75–C, No. 12, Dec. 1992.

*Primary Examiner*—Stephen D. Meier
*Attorney, Agent, or Firm*—Cushman, Darby & Cushman

[57] ABSTRACT

A semiconductor device of an SOIMOSFET comprising a semiconductor substrate, an insulating layer and a thin film single-crystalline semiconductor layer, the insulating layer containing a floating electrically conductive layer buried therein at a portion corresponding to the channel, the floating electrically conductive layer being electrically insulated from the other portions, the semiconductor device further comprising an electrode adjacent to the floating electrically conductive layer for applying a voltage by which an electric charge is injected into and stored in the floating electroconductive layer.

10 Claims, 13 Drawing Sheets

SOI MOSFET WITH FLOATING GATE

BACKGROUND OF THE INVENTION

1. Field of the Invention

The present invention relates to a semiconductor device, and more specifically to a MOSFET having an SOI (Silicon On Insulator) structure in which the threshold voltage can be controlled.

2. Description of Related Art

In order to increase the speed and integration degree of semiconductor devices, a MOSFET formed in a single crystal layer on an insulator (SOI) has been investigated. In the case where the thickness of an SOI layer is lower than the maximum depth of the depletion layer of the channel region of a MOSFET and the SOI layer is completely depleted during formation of a channel (this type of device is herein after referred to as a thin film SOIMOSFET), excellent characteristics, such as controlled short channel effect and increased effective mobility due to a moderate electric field in the direction perpendicular to the channel, in comparison with a MOSFET formed in a bulk silicon substrate, are obtained.

The MOSFET must be made to the normally-off state (the threshold voltage is positive for an N-channel) in order to apply a MOSFET to a complementary type MOS circuit. In a conventional N-channel thin film SOIMOSFET with an $N^+$ polysilicon gate, the single crystalline layer (SOI layer) with a thickness of about 0.1 µm has such a concentration of the impurity that the SOI layer is completely depleted, so that the SOI layer becomes the normally-on state, i.e., the FET is a depletion type, and it is difficult to control the threshold voltage thereof to the normally-off state or to make the FET enhancement type.

In order to make the threshold voltage to the normally-off state or the FET enhancement type, there are proposed (1) a gate electrode 130 made of a material such as $P^+$-polysilicon or a metal in order to utilize a difference of work function, as shown in FIG. 1 (see JP-A-01-307270), and (2) a method of providing an opposite electrode 132 on the side of the substrate 131 and applying a negative potential to the opposite electrode 132, as shown in FIG. 2 (see JP-A-02-294076).

Nevertheless, in the above (1), the range of the threshold voltage which can be controlled by the gate material is limited and the gate material must be changed when the power voltage and thus the designed threshold voltage are changed. Moreover, if a metal or silicide is used for the gate, the difference of thermal expansion coefficient with that of a silicon substrate causes a stress. In the above (2), a circuit for giving a bias voltage is required, which sacrifices the integration degree of elements.

The object of the present invention is therefore to provide a semiconductor device in which an $N^+$ or $P^+$ polysilicon gate is used but the threshold voltage of the thin SOIMOSFET can be easily controlled.

SUMMARY OF THE INVENTION

The above object of the present invention is attained by providing a semiconductor device comprising a semiconductor substrate and a thin film single-crystalline semiconductor layer with an insulating layer interposed therebetween, the semiconductor device having a MOSFET comprising source and drain regions in the thin film single-crystalline semiconductor layer, a gate insulating film on the thin film single-crystalline semiconductor layer, and a polysilicon gate on the gate insulating film, the thin film single-crystalline semiconductor layer having a channel region at a portion corresponding to the polysilicon gate, the insulating layer containing a floating electroconductive layer buried therein, the floating electroconductive layer being located at least at a position corresponding to the channel region of the MOSFET and being electrically insulated from other portions, and the semiconductor device further comprising near the floating electroconductive layer an electrode for applying a voltage to store electric charges in the floating electrocondutive layer.

An embodiment of the above present invention includes a semiconductor device comprising a semiconductor substrate and a thin film single-crystalline semiconductor layer with a first insulating layer interposed therebetween, the semiconductor device having a MOSFET comprising source and drain regions in the thin film single-crystalline semiconductor layer, a gate insulating film on the thin film single-crystalline semiconductor layer, and a polysilicon gate on the gate insulating film, the thin film single-crystalline semiconductor layer having a channel region at a portion corresponding to the polysilicon gate, the semiconductor device further comprising a floating electroconductive layer under the first insulating layer at least at a position corresponding to the channel region of the MOSFET and a second insulating layer underlying the floating electroconductive layer, the floating electroconductive layer being buried by the first and second insulating layers and being electrically insulated from others, and the semiconductor device further comprising near the floating electroconductive layer an electrode for applying a voltage to store electric charges in the floating electroconductive layer.

Other variations and modifications are clear for a person skilled in the art from the following descriptions of preferred embodiments and claims.

Storing a desired electric charge in the floating electroconductive layer changes the potential distribution in the channel region of the thin film SOIMOSFET, by which the threshold voltage of the FET can be shifted under control to a desired value.

DESCRIPTION OF THE PREFERRED EMBODIMENTS

The present invention is described more in detail with reference to the following embodiments and drawings.

(First Embodiment)

Figure 3:
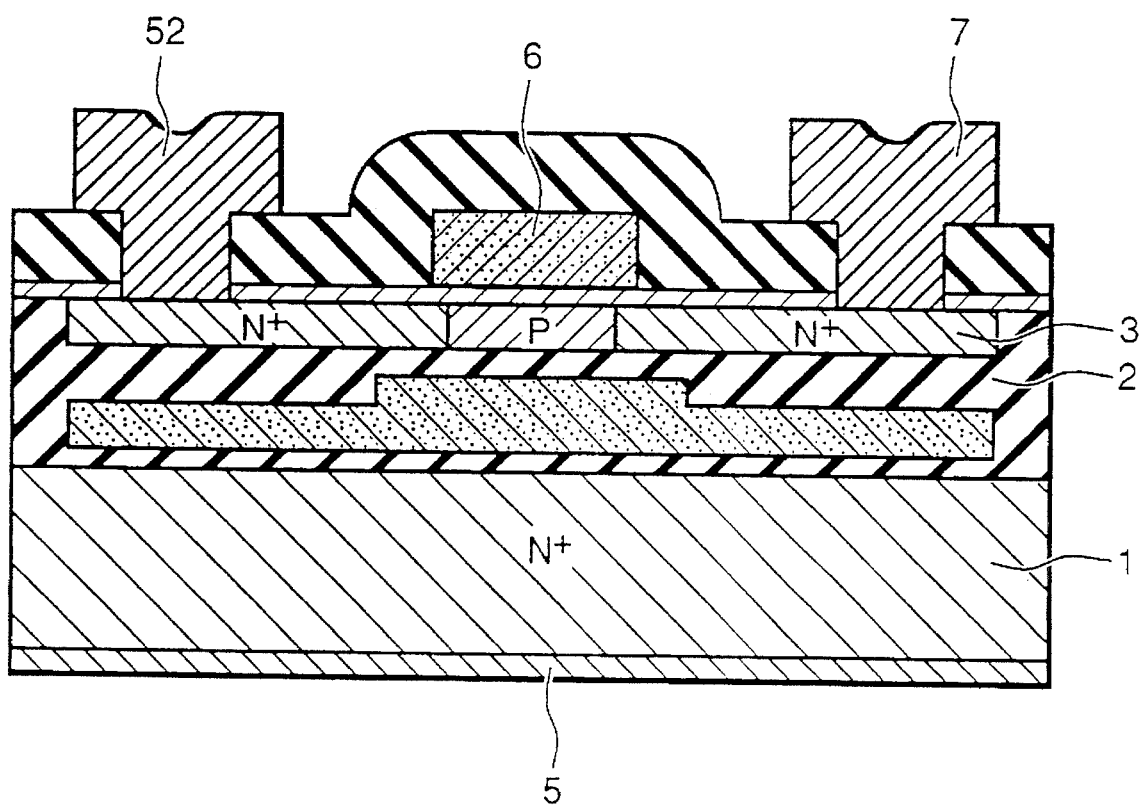
FIG. 3 is a cross-sectional view of a semiconductor device of the first embodiment of the present invention.

FIG. 3 illustrates a cross-sectional structure of a semiconductor device of the first embodiment of the present invention.

In an $N^+$-single crystalline silicon substrate 1, a buried $SiO_2$ layer (insulating layer) 2 is formed. A thin film single-crystalline silicon layer (SOI layer) 3 is formed on the $SiO_2$ layer 2, and an N-channel MOSFET with an $N^+$ polysilicon gate 6 is formed on the thin film single-crystalline silicon layer 3. The thin film single-crystalline silicon layer 3 is thinner than the maximum width of the depletion layer of the MOSFET so that the SOI layer is completely depleted when a channel is generated. The $SiO_2$ layer 2 contains an $N^+$-polysilicon layer (floating electrically conductive layer) 4 which is surrounded by and floating in $SiO_2$.

The $N^+$ polysilicon layer 4 is formed in such a shape that the capacity $C_1$ of the $SiO_2$ layer between the $N^+$-polysilicon layer 4 and the channel region of the N-channel MOSFET formed in the single-crystalline layer 3 is larger than the capacity $C_2$ of the $SiO_2$ layer between the N+-polysilicon layer 4 and the regions other than the channel region of the N-channel MOSFET. That is, the thickness of the $SiO_2$ layer between the $N^+$-polysilicon layer 4 and the channel region of the N channel MOSFET is thinner than that for the other regions.

Figure 1:
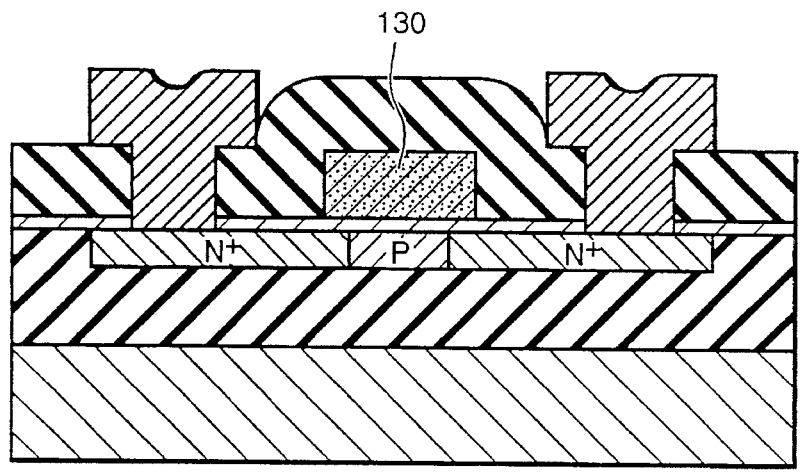
FIGS. 1 and 2 are cross-sectional views of semiconductor devices of the prior art.

A metal electrode (electrode for applying a voltage) 5 is formed on the rear surface of the single-crystalline substrate 1 so that the potential of the single-crystalline substrate 1 can be controlled. In the structure as shown in FIG. 1, for example, if the channel region has an impurity concentration of $1 \times 10^{15} cm^{-3}$, the threshold voltage of the MOSFET is negative and the MOSFET is in the normally-on state. However, storing negative electric charges in the floating $N^+$ polysilicon layer 4 can make the threshold voltage shift to positive, i.e., the MOSFET in the normally-off state.

The means for storing negative electric charges in the floating $N^+$ polysilicon layer 4 can be, for instance, by grounding the $N^+$ polysilicon gate 6 and the source electrode 52 and applying a high voltage to the metal electrode (rear electrode) 5 and a drain electrode 7, so as to form a channel in the single-crystalline layer 3. As a result, channel hot electrons appear in the single-crystalline layer 3 and the electrons are injected into the floating $N^+$ polysilicon layer 4 to store negative electric charges therein. The amount of the stored negative charges can be controlled by the ratio between the capacity $C_1$ of the $SiO_2$ layer and the capacity $C_3$ of the $SiO_2$ layer between the floating $N^+$ polysilicon layer 4 and the single crystalline substrate 1, or by the time period of electric charge injection. By the amount of the injected charge, the threshold voltage of the MOSFET can be controlled to a desired value.

An example of method for manufacturing the above semiconductor device is described below with reference to FIGS. 4 to 13.

Figure 4:
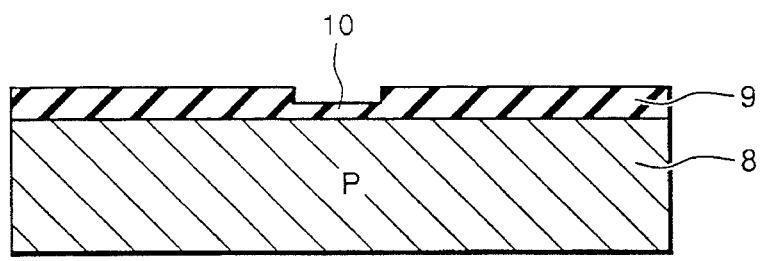
FIGS. 4 to 13 are cross-sectional views of a semiconductor device of the first embodiment of the present invention in main steps of the manufacture.

As shown in FIG. 4, a P-type single-crystalline substrate 8 with a high resistance is prepared. The main surface of the silicon substrate 8 is thermally oxidized to form an oxide film 9, for example, 100 nm thick. A portion of the oxide film 9 corresponding to a channel region to be formed is selectively removed and thermal oxidation is again conducted to form there an oxide film ($SiO_2$) 10 with a thickness of, e.g., 35 nm.

Figure 5:
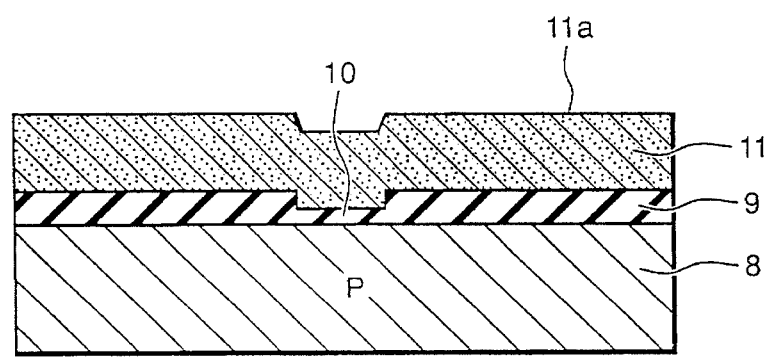

As shown in FIG. 5, a polysilicon layer 11 is deposited on the silicon substrate 8, for example, by CVD to a thickness of 1 μm, and phosphorus, an N type impurity, is introduced into the polysilicon layer 11, for example, by diffusion.

Figure 6:
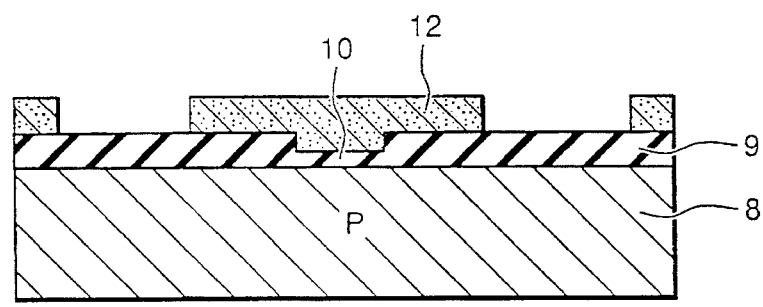

Subsequently, as shown in FIG. 6, the surface 11a of the polysilicon layer 11 is polished to a thickness of about 300 nm. A portion of the polysilicon layer 11 is etched, for example, by dry etching, to form an island 12 of the polysilicon layer having a size almost same as that of a MOSFET to be formed later.

Figure 7:
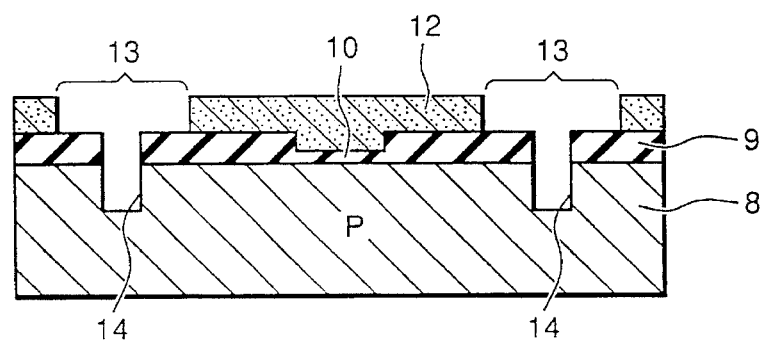

As shown in FIG. 7, a groove 14 with a width of 3 μm and a depth of 5 μm is formed by dry etching in an area 13 of the silicon substrate 8 where the polysilicon layer 11 is not formed. A portion of the groove 14 extends to the periphery of the silicon substrate 8 and opens on the side surface of the silicon substrate 8.

Figure 8:
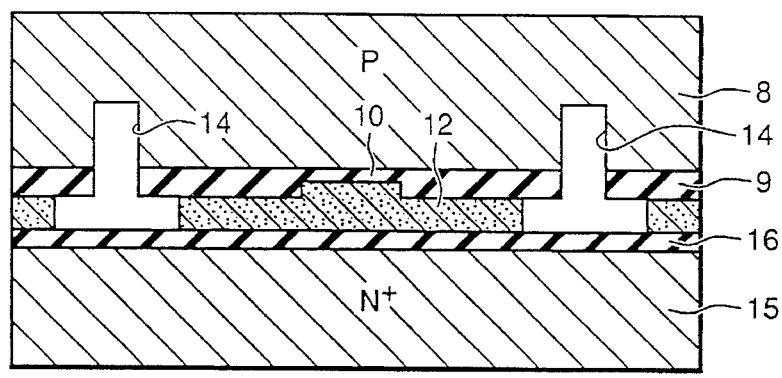

As shown in FIG. 8, an $N^+$ type low resistance single-crystalline silicon substrate 15 is prepared and the surface of the silicon substrate 15 is oxidized to form an oxide film 16 with a thickness of about 40 nm. The silicon substrate 15 and the silicon substrate 8 having the island 12 of the polysilicon layer 12 are bonded into a consolidated body 17 by a direct bonding method. The consolidated body 17 contains vacancies, in the area where the polysilicon layer 12 is removed and the groove 14.

Figure 9:
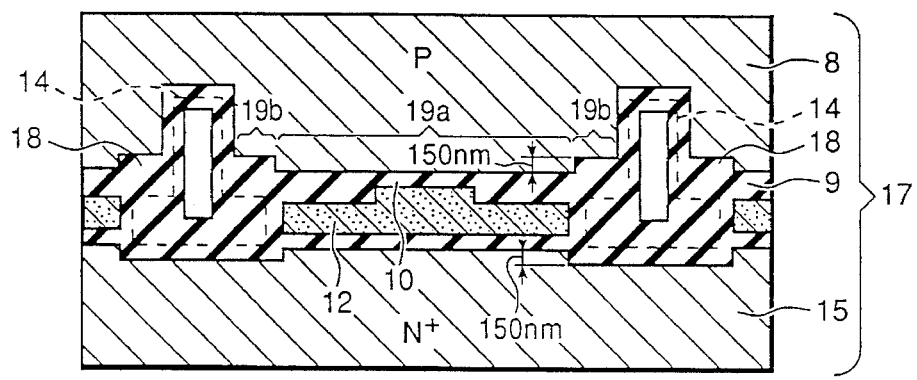

As shown in FIG. 9, the consolidated body 17 is wet oxidized, for example, at 950° for 4 hours, so that the surface of the vacancies is oxidized through the groove 14 opened on the side surface of the silicon substrate to completely fill the vacancies with thermally oxidized silicon 18 while remaining the groove 14 still open. At this time, the thermally oxidized silicon 18 grows into the silicon substrates 8 and 15 and, as a result, steps with a height of about 150 nm are formed on the lower surface of the silicon substrate 8 and on the upper surface of the silicon substrate 15 between the area 19a where the polysolicon 12 retains and the area 19b where the polysilicon 12 was removed.

Figure 10:
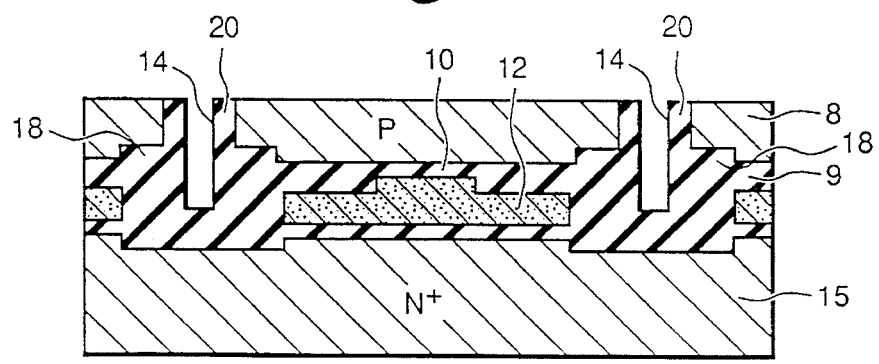

As shown in FIG. 10, the side of the silicon substrate 8 of the consolidated body 17 is polished until the groove 14 appears.

Figure 11:
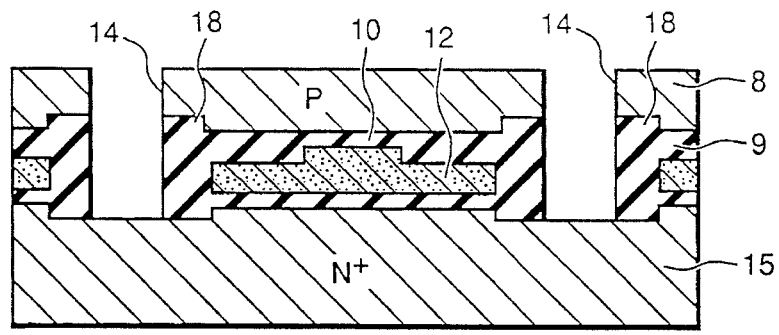

Subsequently, as shown in FIG. 11, the oxide film 20 formed on the surface of the groove 14 is removed, for example, by hydrofluoric acid.

Figure 12:
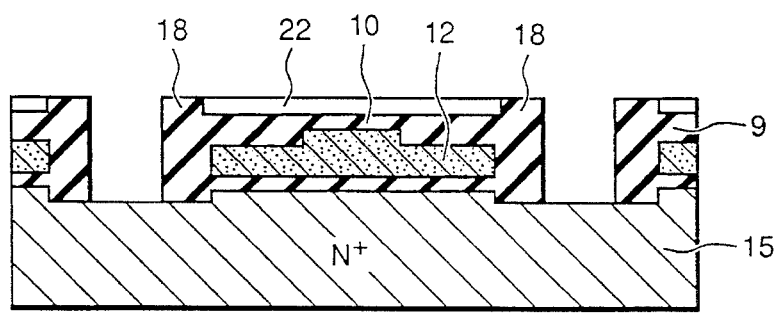

As shown in FIG. 12, the silicon substrate 8 is selectively polished until the thermally oxidized silicon 18 appears in the area 19b where the polysilicon layer 18 was removed. This selective polishing is a polishing in that the etching rate for silicon is effectively faster than that of $SiO_2$, for example, with an amine etching solution, so that the $SiO_2$ acts as an etching stopper and a silicon layer with a uniform thickness is obtained. As a result, an SOI layer 12 with a thickness of about 120 nm is formed only on the area 19a where the polysilicon 12 exists, and a floating N⁺ polysilicon layer 12 is located below the SOI layer 12.

Figure 13:
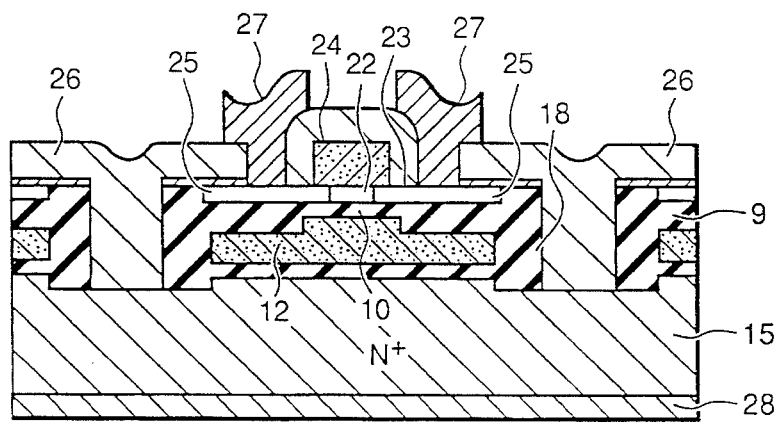

Finally, as shown in FIG. 13, a gate oxide film 23 with a thickness of about 30 nm, a gate N⁺ polisilicon layer 24, source and drain layers 25, an interlayer insulating layer 26, a metal electrode 27 and a rear side metal electrode 28 are formed to form a MOSFET in the SOI layer 22. Thus, a semiconductor device is completed.

For injecting electric charges into the floating N⁺ polysilicon layer 12, the source and gate electrodes are made grounded (0 V) and voltages are applied to the drain electrode (for example, 10 V) and the rear side metal electrode 28 (for example, 12 V), by which a channel is formed in the MOSFET on the side of the silicon substrate 15 and the MOSFET becomes the on-state. Due to a high electric field appeared in the vertical direction of the channel, channel hot electrons are generated and injected through the oxide layer 10 into the floating N⁺ polysilicon layer 4 so that a negative electric charge is stored.

In this embodiment, a semiconductor device comprises a silicon substrate (semiconductor substrate) 1 having a buried $SiO_2$ layer (insulating layer) 2 and a thin film single-crystalline silicon layer (single-crystalline semiconductor layer) 3, a N-channel MOSFET being formed in the single crystalline silicon layer 3 with an N⁺-polysilicon gate 6, in which a polysilicon layer (floating electroconductive layer) is buried in the buried $SiO_2$ layer 2 at least a location corresponding to the channel region of the MOSFET, the polysilicon layer being electrically insulated from the other elements or portions, and a metal electrode (voltage applying electrode) 5 is provided on the rear side of the silicon substrate 5, by which a negative electric charge is stored in the polysilicon layer 4. By storing a desired negative charge in the polysilicon layer (floating electroconductive layer) 4, the potential distribution in the channel region of the N-channel thin film SOIMOSFET can be varied so that the threshold voltage of the depletion-type N-channel thin film SOIMOSFET can be easily shifted to an enhancement-type one. As a result, it is possible that while an N⁺ polysilicon gate is used, the threshold voltage of a depletion-type N-channel thin film SOIMOSFET can be easily shifted to an enhancement-type one.

(Second Embodiment)

The second embodiment is described, particularly concentrating in the differences thereof with the first embodiment.

Figure 14:
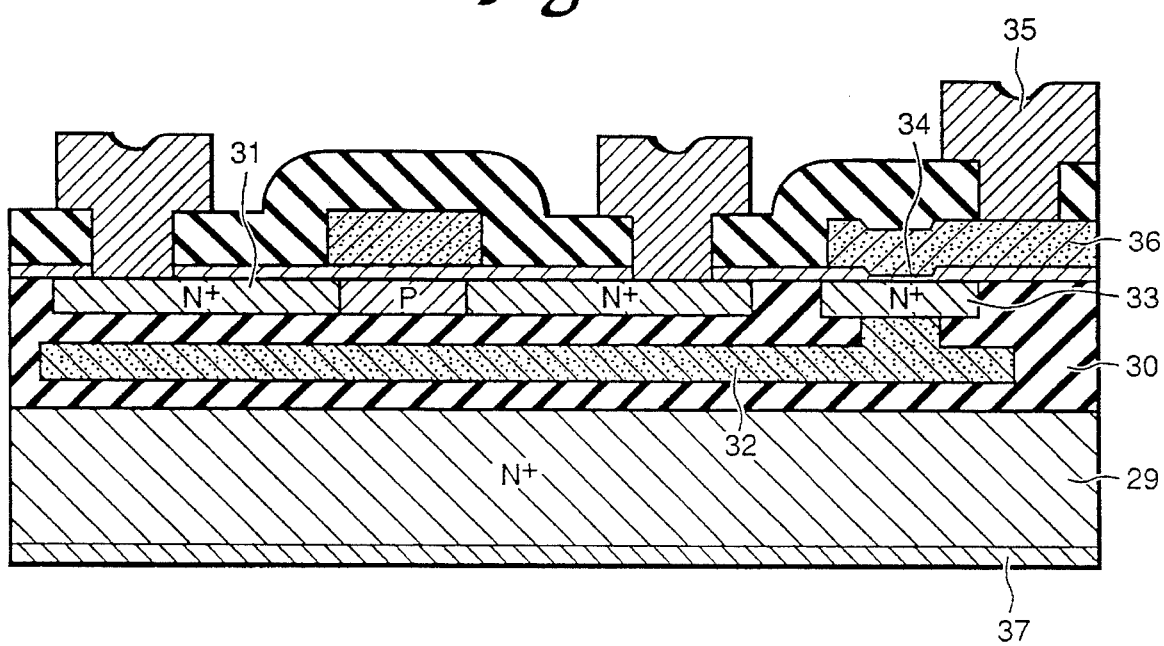
FIG. 14 is a cross-sectional view of a semiconductor device of the second embodiment of the present invention.

FIG. 14 shows a cross section of a semiconductor device of the second embodiment. A buried $SiO_2$ layer (insulating layer) 30 is formed in a single-crystalline silicon substrate 29 and a thin single-crystal silicon layer (SOI layer) 31 is formed on the $SiO_2$ layer 30. In the single-crystal silicon layer 31, an N-channel thin film SOIMOSFET having an N⁺ polysilicon gate is formed. Further, an N⁺ polysilicon layer 32 is buried in the $SiO_2$ layer 30 and the N⁺ polysilicon layer 32 is connected with a single-crystal silicon layer 33 formed on the $SiO_2$ layer 30 and insulated from the single-crystal silicon layer 31 on which a MOSFET is formed. The N⁺ polysilicon layer 32 and the single-crystal silicon layer 33 is composed of a floating electroconductive layer.

There is formed on a portion of the surface of the single-crystal silicon layer 33 a thin tunnel oxide film 34, on which an N⁺ polysilicon layer 36 connected to an electrode 35 is formed. A metal electrode 37 is formed on the rear side of the silicon substrate 29, by which the potential of the substrate 29 can be varied.

Also, in this embodiment as in the first embodiment, by storing a negative electric charge in the floating electroconductive layer (32, 33), the threshold voltage of a MOSFET can be controlled to a desired value. The injection of the electric charge into the floating electroconductive layer (32, 33) is conducted by applying a high voltage to the electrode 35 and the metal electrode 37 so that electron F-N (Fowler-Nordheim) tunnel injection from the N⁺ polysilicon layer 36 to the single crystal silicon layer 33 through the tunnel oxide layer 34 occurs.

Although the tunnel oxide film 34 is formed between the N⁺ polysilicon layer 36 and the single crystal silicon layer 33 in this embodiment, a tunnel oxide film may be formed between the N⁺ polysilicon layer 32 and the single crystal silicon layer 33 so that the N⁺ polysilicon layer 36 and the single crystal silicon layer 33 are electrically connected.

(Third Embodiment)

The third embodiment is described, particularly concerning the differences thereof with the first embodiment.

Figure 15:
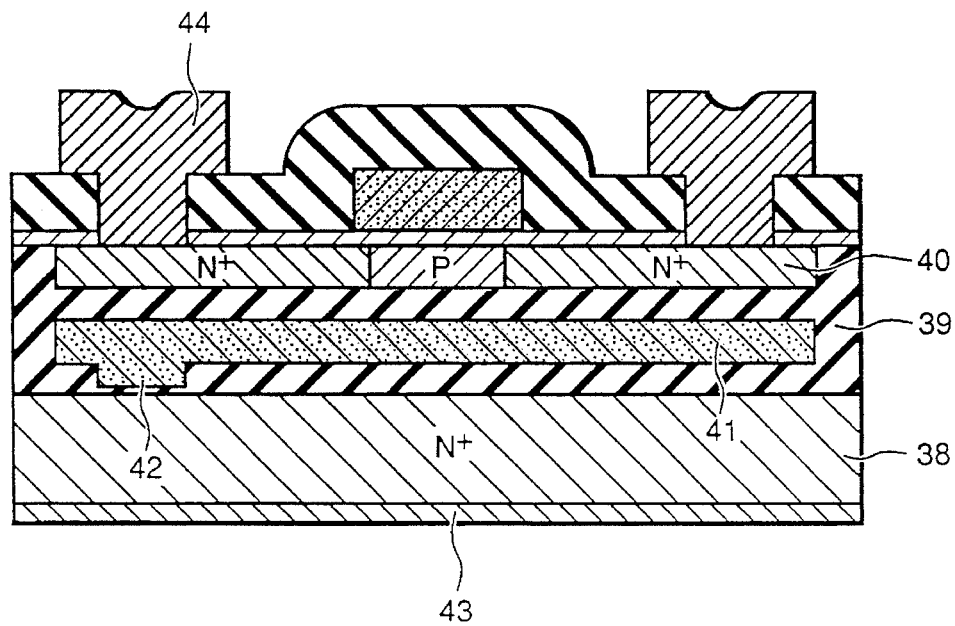
FIG. 15 is a cross-sectional view of a semiconductor device of the third embodiment of the present invention.

FIG. 15 shows a cross section of a semiconductor device of the third embodiment. A buried $SiO_2$ layer (insulating layer) 39 is formed in a single crystal silicon substrate 38 and a thin film single crystal silicon layer (SOI layer) 40 is formed on the $SiO_2$ layer 39. On the single-crystal silicon layer 40, an N-channel thin film SOIMOSFET having an N⁺ polysilicon gate is formed. Further, an N⁺ polysilicon layer 41 is buried in the $SiO_2$ layer 39 and the N⁺ polysilicon layer 39 is a floating electroconductive layer insulated from the other elements or portions. There is formed a thin tunnel oxide film 34 on a portion of the single-crystal silicon layer 41 on the side of the substrate 38. A metal electrode 43 is formed on the rear side of the silicon substrate 43, by which the potential of the substrate 38 can be varied.

Also, in this embodiment as in the first and second embodiments, by storing a negative electric charge in the floating electroconductive layer (41), the threshold voltage of a MOSFET can be controlled to a desired value. The injection of the electric charge into the floating electroconductive layer (41) is conducted by applying a high voltage to the source electrode 44 and the metal electrode 43 so that electron F-N (Fowler-Nordheim) tunnel injection from the substrate 38 to the floating electroconductive layer (41) through the tunnel oxide layer 42 occurs.

(Fourth Embodiment)

The fourth embodiment is described, particularly concentrating in the differences thereof with the above embodiments.

Although one floating electroconductive layer is formed for one MOSFET in the first, second and third embodiments, one floating electroconductive layer is formed for a plurality of MOSFETs in this embodiment.

Figure 16:
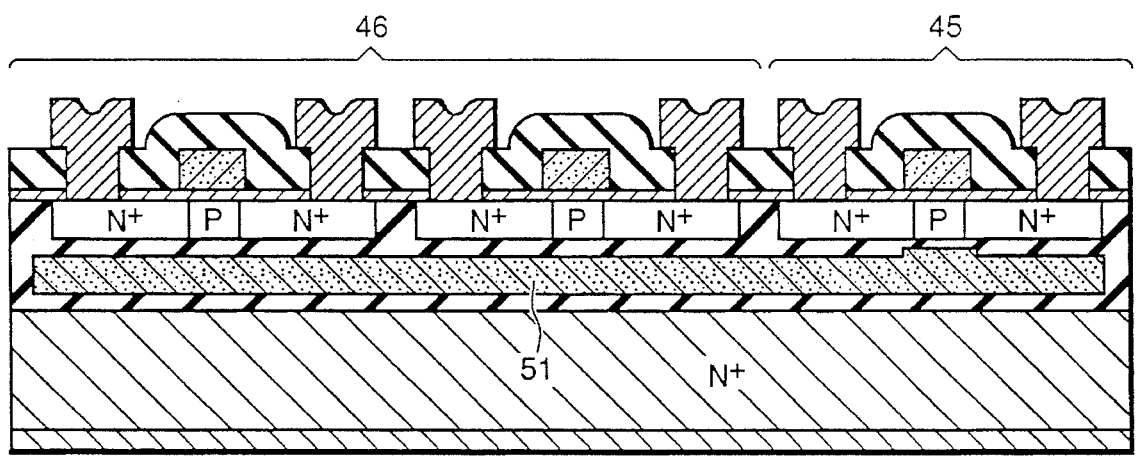
FIG. 16 is a cross-sectional view of a semiconductor device of the fourth embodiment of the present invention.

FIG. 16 shows a cross section of a semiconductor device in which the first embodiment, for example, is applied to a plurality of MOSFETs.

As shown in the FIG. 16, only one MOSFET 45, to be used for injecting electric charges to a floating electroconductive layer 51, has a structure as shown in FIG. 3 and the other MOSFETs 46 have a structure in which the thickness of the $SiO_2$ layer between the polysilicon layer (51) and the channel region is equal to that between the polysilicon layer (51) and portions other than the channel region.

Figure 17:
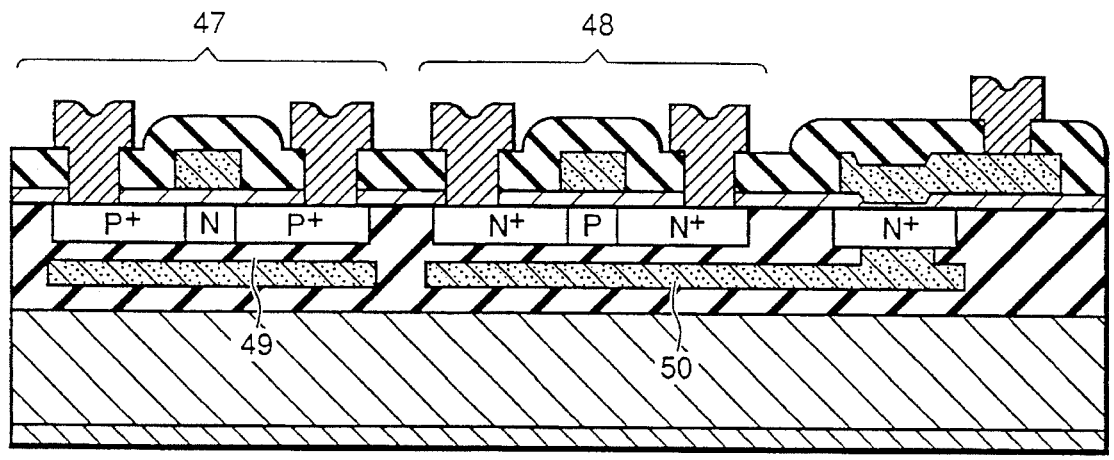
FIG. 17 is a cross-sectional view of a modification of a semiconductor device of the fourth embodiment of the present invention.

Further, as an application of this embodiment, as shown in FIG. 17, the structure of the second embodiment may be applied, for example, to a complementary type MOS circuit. In this case, both P-channel MOSFET 47 and N-channel MOSFET 48 comprise a floating electroconductive layer below an SOI layer, but the floating electroconductive layer 49 below the P-channel MOSFET 47 and the floating electroconductive layer 50 below the P-channel MOSFET 48 may be separated and negative electric charges be stored only in the floating electroconductive layer 50 below the P-channel MOSFET 48, because the threshold voltage of a P-channel MOSFET using an N⁺-type gate easily becomes enhancement-type.

(Fifth Embodiment)

FIGS. 18 to 34 show embodiments of semiconductor devices in which another polysilicon layer is provided below the floating dielectric layer of a polysilicon layer.

Figure 18:
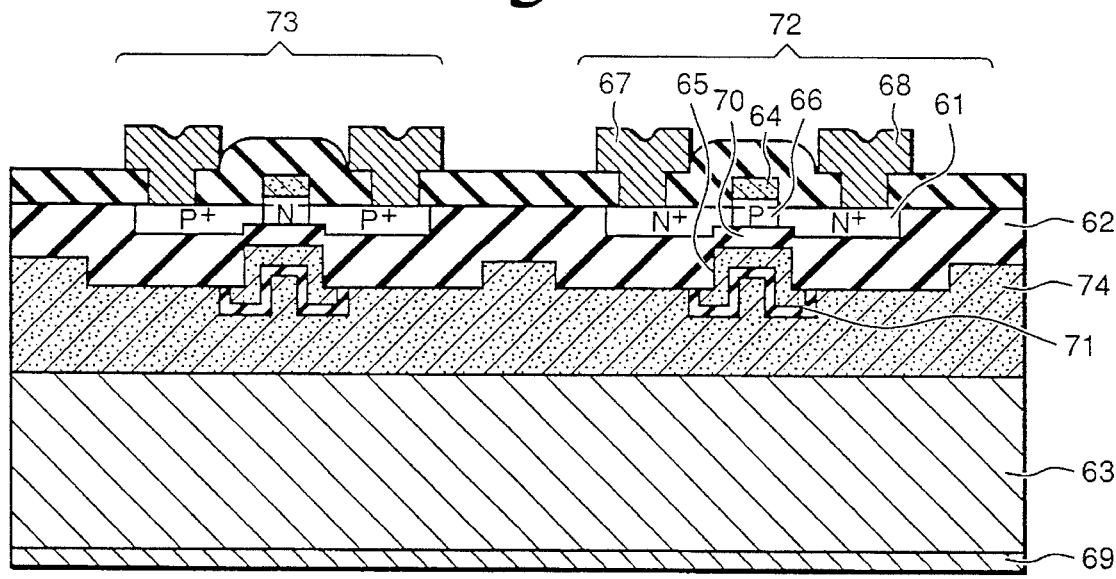
FIG. 18 is a cross-sectional view of a semiconductor device of the fifth embodiment of the present invention.

FIG. 18 shows a cross section of a semiconductor device of the fifth embodiment. In FIG. 18, 63 denotes a single crystal silicon substrate, on which two polysilicon layers 65 and 74 insulated by an $SiO_2$ layer 71 interposed therebetween are formed. On these polysilicon layers 65 and 74, there is formed a buried $SiO_2$ layer 62 and 70. On the $SiO_2$ layer 62 and 70, there is formed a thin single crystalline silicon layer (SOI layer) 61 in which an N-channel MOSFET 72 and a P-channel MOSFET 73 having an N⁺ polysilicon gate 64 are formed. The silicon layer 61 has such a thickness that is thinner than the maximum width of the depletion layer of the channel region of the MOSFET and the silicon layer 61 (channel region) is completely depleted when a channel is formed. The polysilicon layer 65 is doped with an N-type impurity at a high concentration and is completely surrounded by the $SiO_2$ so that it is a floating electroconductive layer. The polysilicon layer 74 is doped with an N-type impurity at a high concentration at least on the side of the buried $SiO_2$ layer 62 and is connected to the substrate 63 on which an outer metal electrode 69 is formed.

In the structure as shown in FIG. 18, for example, when the channel region of the N-channel MOSFET has a concentration of impurity of about $1 \times 10^{15} cm^{-3}$, the threshold voltage becomes negative and the MOSFET is in the normally-on state. By storing a negative electric charge in the floating electroconductive layer 65, the threshold voltage of the N-channel MOSFET can be shifted to positive, i.e., in the state of normally-off. In a P-channel MOSFET, the threshold voltage is normally as high as near −0.9 V (absolute value), but, by storing negative electric charges, it can be shifted to the positive side so that it can have a desirable lower value (for example, −0.6 V).

The method for storing a negative electric charge in the floating N⁺ polysilicon layer 65 may comprise, for example, grounding a gate electrode 64 on the surface side thereof and applying such a high voltage to a rear surface electrode 69 and a drain electrode 67 that channel hot electrons appear in the channel of MOSFET on the side of the buried $SiO_2$ layer 70, by which hot-electron-injection into the floating N⁺ polysilicon layer 65 occurs and a negative charge is stored in the floating polysilicon layer 65. The amount of the negative charge stored can be controlled by a ratio of the capacity C1 of the portion of the $SiO_2$ layer 70 to the capacity C2 of the portion of the $SiO_2$ layer 71, the time of injecting electric charge, or so forth, and the threshold voltage of a MOSFET can be controlled to a desired value by the amount of the injected electric charge.

An example of a concrete process for manufacturing a semiconductor device of the fifth embodiment is described with reference to FIGS. 19 to 30 which show cross sections of main parts of the semiconductor device in the manufacturing steps.

First, an N⁺-type low resistance single-crystalline silicon substrate 75 and a P-type high resistance single-crystalline silicon substrate 76 are prepared.

Figure 19:
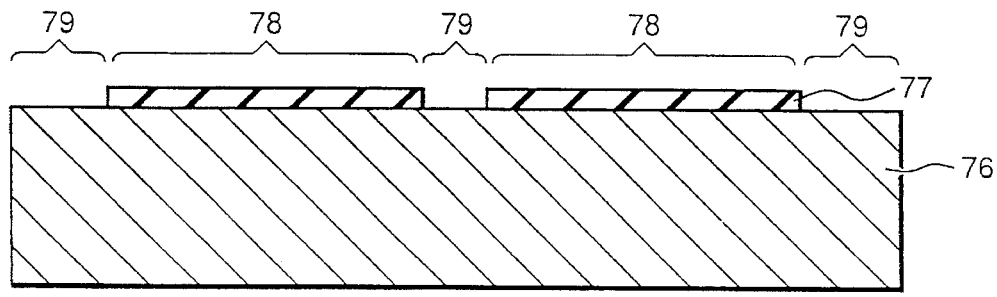
FIGS. 19 to 30 are cross-sectional views of a semiconductor device of the fifth embodiment of the present invention in main steps of the manufacture.

As shown in FIG. 19, the high resistance substrate 76 is thermally oxidized to form an oxide film 77 having a thickness of, for example, about 100 nm and an area 79 of the oxide film 77 other than areas 78 where MOSFET are to be formed is removed.

Figure 20:
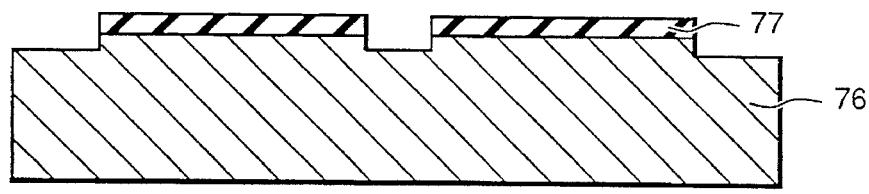

As shown in FIG. 20, the silicon substrate 76 is etched by dry ion etching with the oxide film 77 used as a mask to a depth of about 200 nm.

Figure 21:
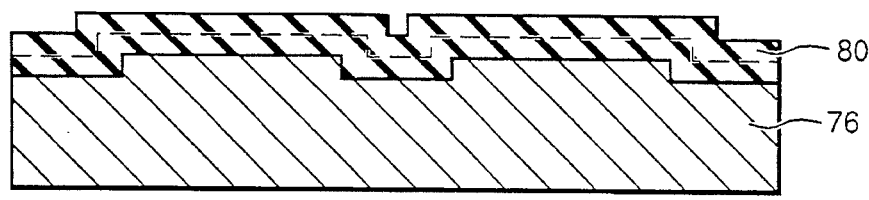

The oxide film 77 used as the mask is then removed and, as shown in FIG. 21, an oxide layer ($SiO_2$) 80 having a thickness of about 600 nm is formed on the surface of the substrate 76 by thermal oxidation or CVD.

Figure 22:
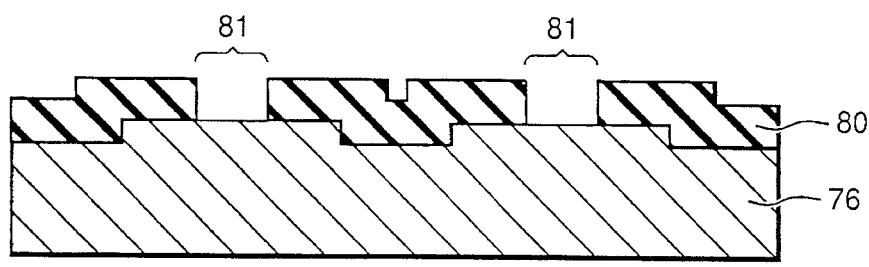
Figure 23:
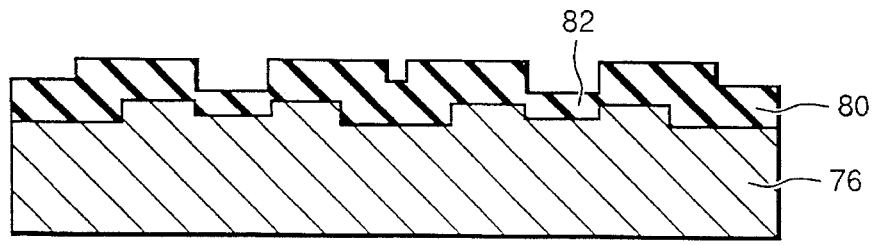

Subsequently, the oxide layer 80 at portions 81 which become channel regions of MOSFETs are removed as shown in FIG. 22, and an oxide film 82 having a thickness of about 100 nm is then formed including on the surface of the substrate 76 by thermal oxidation or CVD as shown in FIG. 23.

Figure 24:
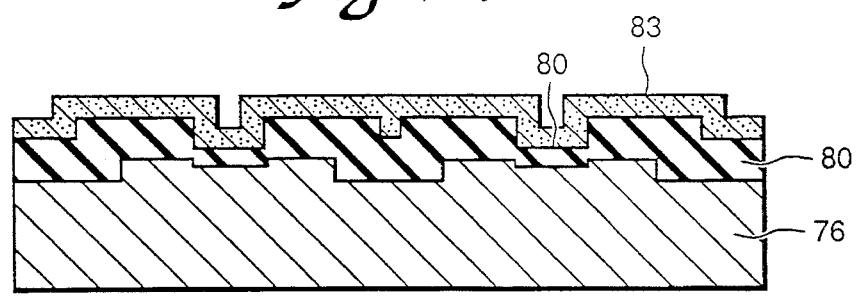

As shown in FIG. 24, there is deposited on the substrate a polysilicon layer 83 with a thickness of about 35 nm by CVD, and phosphorus (an N-type impurity) is then introduced into the polysilicon layer 83, for example, by thermal diffusion.

Figure 25:
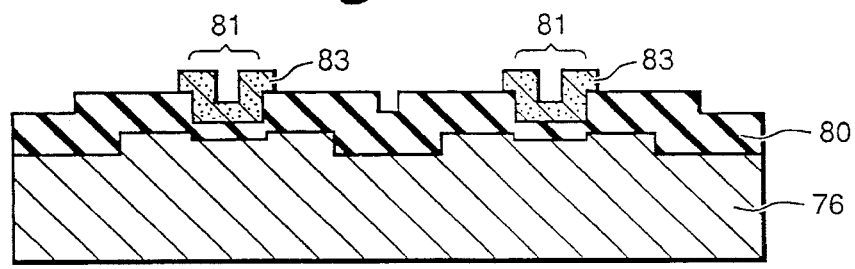

AS shown in FIG. 25, the polysilicon layer 83 is patterned. After this patterning, the polysilicon layer 83 remains at least in the portions where channel regions of MOSFETs are formed.

Figure 26:
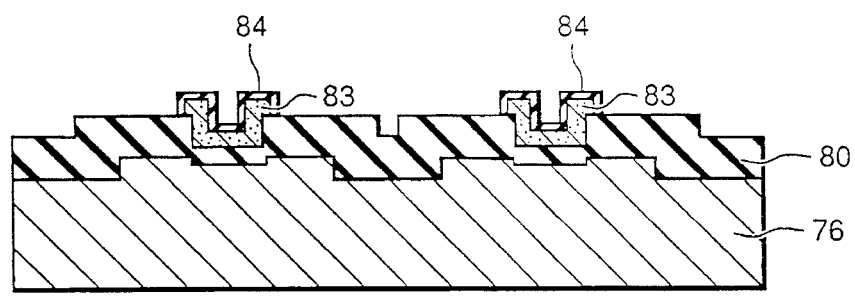

As shown in FIG. 26, an oxide film ($SiO_2$) 84 having a thickness of about 100 nm is formed on the surface of N⁺ polysilicon layer 83, for example, by thermal oxidation.

Figure 27:
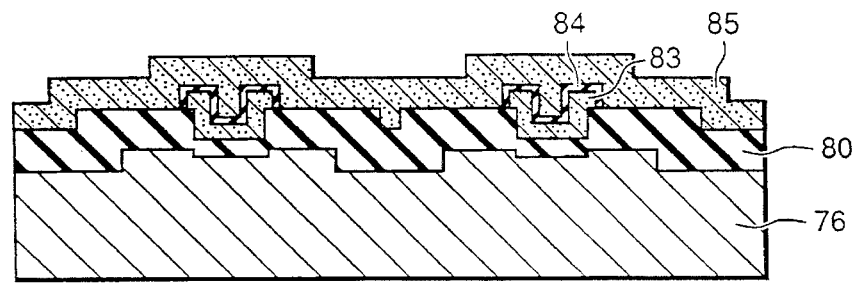

As shown in FIG. 27, there is deposited on the substrate 76 a polysilicon layer 85 with a thickness of about 35 nm by CVD, and phosphorus, an N-type impurity, is then introduced into the polysilicon layer 85, for example, by thermal diffusion.

Figure 28:
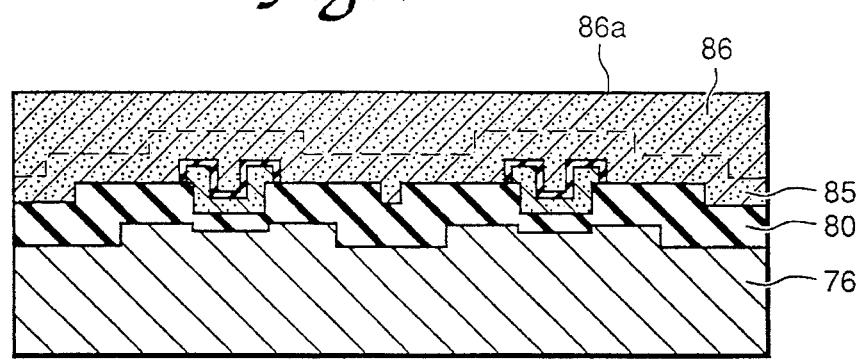

As shown in FIG. 28, there is deposited on the N⁺ polysilicon 85 a polysilicon layer 86 with a thickness of about 5 μm by CVD, and the surface 86a of the deposited polysilicon layer 86 is mirror polished to make the top surface flat.

Figure 29:
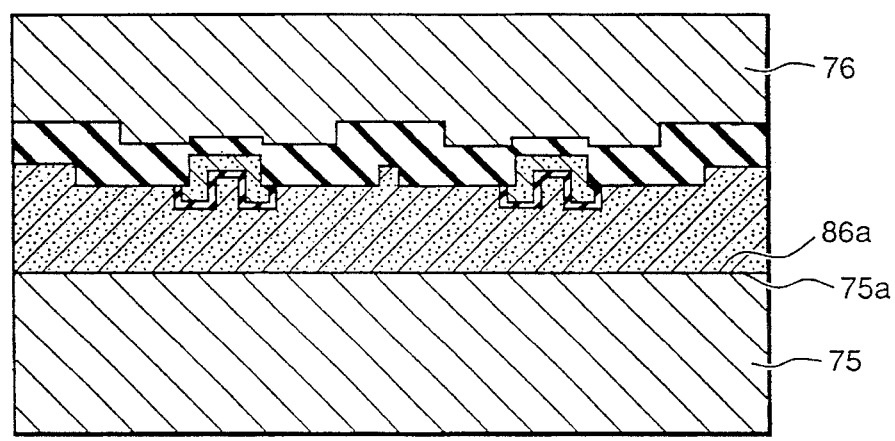

As shown in FIG. 29, the mirror surface 75a of the low resistance substrate 75 and the flattened polysilicon mirror surface 86a of the high resistance substrate 76 are bonded by a direct bonding method to obtain a consolidated body of the substrates.

Figure 30:
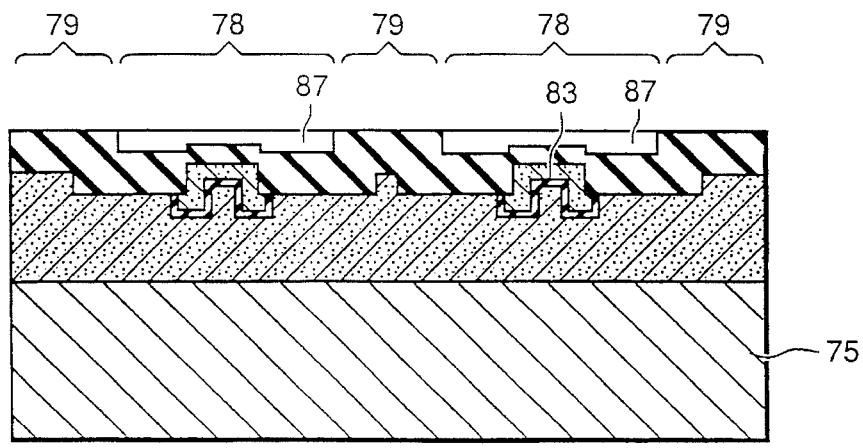

As shown in FIG. 30, the high resistance substrate side is selectively polished until the oxide layer 80 in the area other than the areas 78 which become MOSFETs is exposed. This selective polishing is conducted by using an amine-based polishing solution which has an etching rate of silicon effectively faster than that of $SiO_2$, so that a thin silicon layer having a controlled uniform thickness can be obtained. As a result, an SOI layer 87 having a thickness of about 150 nm is formed and a floating N⁺ polysilicon layer 83 is located below the SOI layer 87.

Finally, N-channel and P-channel MOSFETs are formed in the SOI layer 87 and a metal electrode 69 is formed on the rear surface of the substrate 63, as shown in FIG. 18. Thus, the semiconductor device of the firth embodiment is completed.

In the process of manufacture of the first embodiment as shown in FIGS. 4 to 13, the floating electroconductive layer of polysilicon is polished, but in practice, it is difficult to obtain a polysilicon layer thinner than 1 μm over the substrate by polishing. In contrast, in the process of manufacture as shown in FIGS. 19 to 30, the process is easy since polishing of the floating electroconductive layer is not included. This process can be also used in the following embodiments.

The injection of electric charge into the floating $N^+$ polysilicon layer 65 can be done by grounding a source electrode 68 and a gate electrode 64 and applying 8 V to a drain electrode 67 and 12 V to the rear electrode 69 so that a channel is formed in the N-channel MOSFET on the side of the substrate 63 and the FET becomes the on-state. As a result, a high electric field appears in the vertical direction of the channel, so that channel hot electrons are generated and injected through the oxide film 70 into the floating $N^+$ polysilicon layer 65, by which a negative charge is stored there.

Although in FIG. 19, the floating $N^+$ polysilicon layers 65 are located below the N-channel MOSFET and the P-channel MOSFET, respectively and independently, these may be continuous and comprise one floating $N^+$ polysilicon layer, if the electric charges stored are equal. In the case where an N-channel MOSFET and a P-channel MOSFET have different electric charges to be stored, since a P-channel MOSFET alone cannot generate channel hot electrons and store a negative charge in the floating $N^+$ polysilicon layers 65, an N-channel MOSFET having a floating $N^+$ polysilicon layer common to the P-channel MOSFET, the N-channel MOSFET being adapted to store an electric charge, is necessary.

(Sixth Embodiment)

Figure 31:
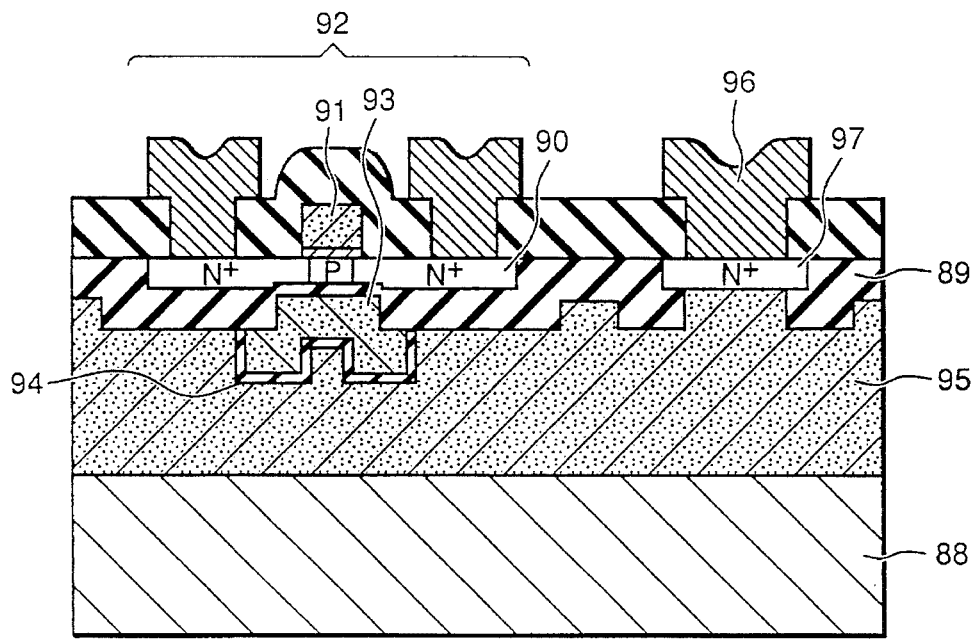
FIG. 31 is a cross-sectional view of a semiconductor device of the sixth embodiment of the present invention.

FIG. 31 shows a cross-sectional structure of a semiconductor device of the sixth embodiment of the present invention.

In FIG. 31, 88 denotes a single-crystalline silicon substrate, as in the first embodiment, in which a buried $SiO_2$ layer (insulating layer) 89 is formed, on which a thin film single-crystalline silicon layer (SOI layer) 90 is formed, on which an N-channel SOIMOSFET 92 with an $N^+$ polysilicon gate 91 is formed. There is an $N^+$ polysilicon layer 93 under the $SiO_2$ layer 89, under which a polysilicon layer 95 is formed with an $SiO_2$ layer 94 interposed therebetween. The $N^+$ polysilicon layer 93 is insulated and isolated from the other elements or portions, so that it is floating. The polysilicon layer 95 comprises an N-type impurity at a high concentration at least on the side of buried $SiO_2$ layer 89 and is connected to a single-crystalline region 97 on which an outer metal electrode 96 is formed in a surface area different from the MOSFET. As shown in figure, an outer metal electrode for injecting an electric charge may be disposed on the surface side of the substrate, as well as on the rear surface side of the substrate.

(Seventh Embodiment)

Figure 32:
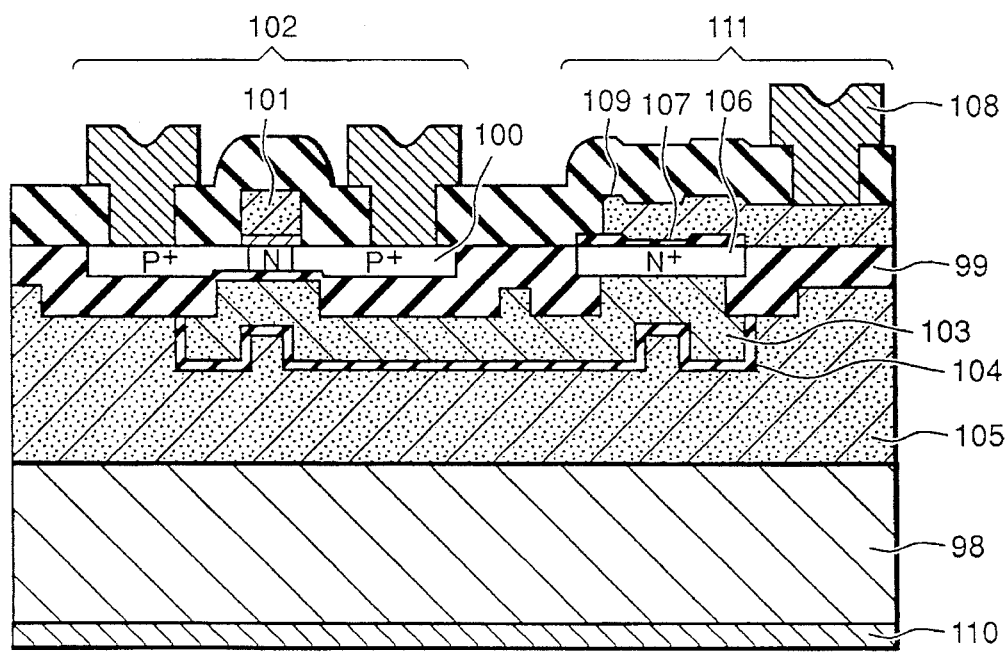
FIG. 32 is a cross-sectional view of a semiconductor device of the seventh embodiment of the present invention.

FIG. 32 shows a cross-sectional structure of a semiconductor device of the seventh embodiment of the present invention.

In FIG. 32, 98 denotes a single-crystalline silicon substrate, as in the first embodiment, in which a buried $SiO_2$ layer (insulating layer) 99 is formed, on which a thin single-crystalline silicon layer (SOI layer) 100 is formed, on which an N-channel SOIMOSFET 102 with an $N^+$ polysilicon gate 101 is formed. There is an $N^+$ polysilicon layer 103 under the $SiO_2$ layer 99, under which in turn a polysilicon layer 105 is formed with an $SiO_2$ layer 104 interposed therebetween. The $N^+$ polysilicon layer 103 is insulated and isolated from the other elements or portions, so that it is comprised of a floating electroconductive layer. A thin tunnel oxide film 107 is formed on a portion of the surface of the single-crystalline silicon layer 106. There is formed on the tunnel oxide film 107 an $N^+$ polysilicon silicon layer 109 connected to an electrode 108. The polysilicon layer 105 is connected to (in contact with) the substrate 98 on the rear surface of which a metal electrode 110 is formed so as to be able to vary the potential of the substrate.

In this embodiment, as in the fifth embodiment, the threshold voltage of the P-channel MOSFET can be controlled to a desired value by storing an electric charge in the floating electroconductive layer. The injection of the electric charge into the floating electroconductive layer is conducted by applying a high voltage between an electrode 108 and a rear electrode 110 so that electrons are F-N (Fowler-Nordheim) tunnel injected from the $N^+$ polysilicon silicon layer 109 to the single-crystalline silicon layer 106 through the tunnel oxide film 107.

Although the tunnel oxide film is formed between the $N^+$ polysilicon silicon layer 109 and the single-crystalline silicon layer 106 in this embodiment, this may be formed between the $N^+$ polysilicon silicon layer 103 and the single-crystalline silicon layer 106 so that the $N^+$ polysilicon silicon layer 103 and the single-crystalline silicon layer 106 are made electrically connected.

In this embodiment, an area of an outer electrode for storing electric charge is the only area which is necessary in addition to the area of the P-channel MOSFET, which allows the area of the device to be smaller in comparison with the fifth embodiment. Although the figure shows the case of a P-channel MOSFET, this embodiment may be applied to an N-channel MOSFET or a plurality of MOSFETs.

(Eighth Embodiment)

Figure 33:
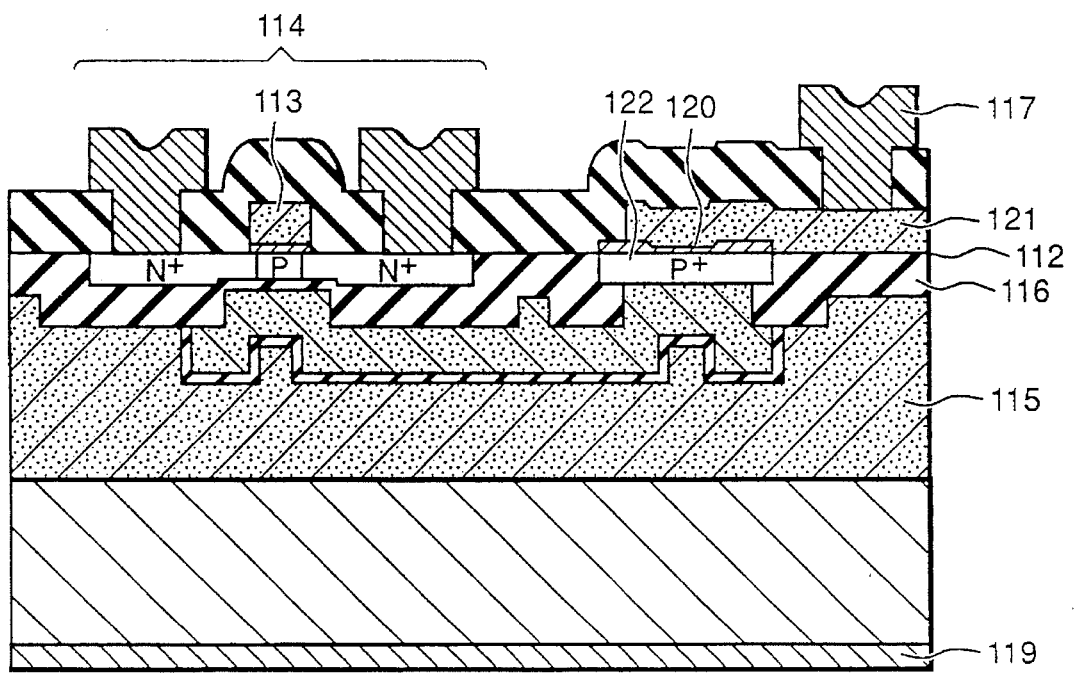
FIG. 33 is a cross-sectional view of a semiconductor device of the eighth embodiment of the present invention.

FIG. 33 shows the eighth embodiment which is a semiconductor device similar to the seventh embodiment except that a $P^+$ polysilicon silicon is used as the floating electroconductive layer 112 and which is applied to an N channel MOSFET 114 with a $P^+$ polysilicon silicon gate. A polysilicon layer 115 is doped with a high concentration of a P-type impurity at least on the side of a $SiO_2$ layer 116. Before storing an electric charge in the floating electroconductive layer 112, the threshold voltage of the channel is fixed to around 0.9 V due to the difference of work function between the substrate and the gate even if the concentration of the impurity in the substrate is made to less than $1 \times 10^{15} cm^{-3}$ as in the P channel MOSFET with a $P^+$ polysilicon silicon gate. This threshold voltage is too high in comparison with 3 V of the power voltage. Nevertheless, by injecting a positive electric charge in the floating electroconductive layer 112, the potential of the substrate may be varied so as to lower the threshold voltage. The injection of positive charges is conducted by applying a high voltage between the electrode 117 and the rear electrode 119 so that F-N (Fowler-Nordheim) tunnel injection of holes occurs from the $P^+$ polysilicon silicon layer 121 through the tunnel oxide film 120 to the single-crystalline silicon layer 122.

Although the fifth, sixth and seventh embodiments used one floating electroconductive layer for one MOSFET in the above, a plurality of floating electroconductive layers for one MOSFET can be used in each embodiment.

Figure 34:
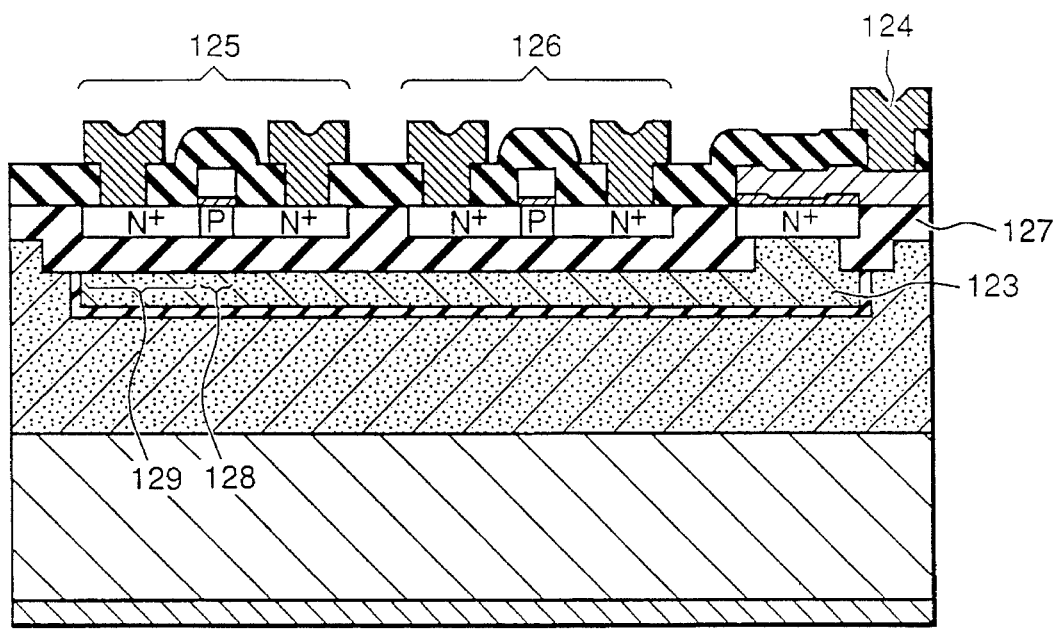
FIG. 34 is a cross-sectional view of a modification of a semiconductor device of the seventh embodiment of the present invention.

FIG. 34 shows a cross-sectional view of a semiconductor device in which the seventh embodiment is applied to a plurality of MOSFETs. In FIG. 34, a floating electroconductive layer is located corresponding to an outer electrode for storing electric charge 124 and two N-channel MOSFETs 125 and 126. As shown in FIG. 34, the thickness of the $SiO_2$ layer 127 between the channel region 128 and $N^+$ polysilicon layer 123 may be equal to the thickness of the $SiO_2$ layer 127 between the regions other than the channel region 128 and N⁺ polysilicon layer 123.

Figure 2:
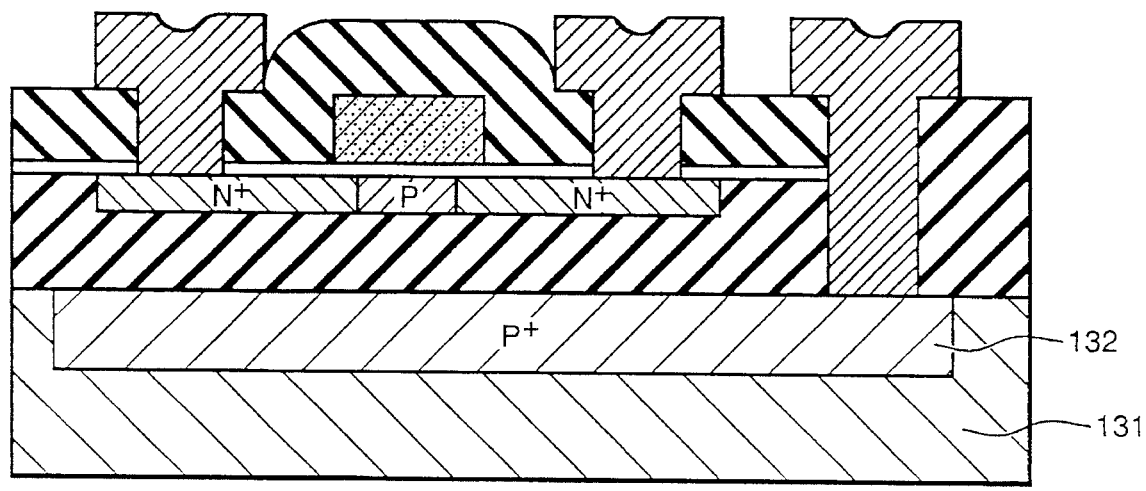

As described above, in accordance with the present invention, a semiconductor device comprising a MOSFET having an SOI structure may have an improved controllability of the threshold voltage of the MOSFET by which the threshold voltage can be always shifted to a desired value. Further, although a conventional device as shown in FIG. 2 requires a power circuit for continuously applying a voltage to the opposite electrode so that the circuit area is increased, the present invention allows such a power circuit to be eliminated. As a result, in accordance with the present invention, without a power circuit, it is possible to improve the controllability of the threshold voltage of a MOSFET so that the threshold voltage can be always shifted to a desired value.

We claim:

1. A semiconductor device comprising
a semiconductor substrate,
a thin film single-crystalline semiconductor layer with an insulating layer interposed therebetween, the insulating layer containing a floating electroconductive layer buried therein,
a MOSFET comprising source and drain regions in the thin film single-crystalline semiconductor layer,
a gate insulating film on the thin film single-crystalline semiconductor layer,
a polysilicon gate on the gate insulating film,
a second thin film single-crystalline semiconductor layer on the insulating layer and insulated from the MOSFET,
a tunnel insulating film on the second thin film single-crystalline semiconductor layer,
a doped polysilicon layer on the tunnel insulating layer,
a second metal electrode layer on the doped polysilicon layer, and
a metal electrode layer connected to the semiconductor substrate acting as an electrode for applying a voltage to store electric charges in the floating electroconductive layer,
the thin film single-crystalline semiconductor layer having a channel region at a portion corresponding to the polysilicon gate,
the floating electroconductive layer being located at least at a position corresponding to the channel region of the MOSFET and being electrically insulated,
wherein the second thin film single-crystalline semiconductor layer is connected to the floating electroconductive layer, whereby the electric charge is introduced in the floating electroconductive layer by applying a voltage between the metal electrode layer and the second metal electrode layer so that electrons are injected from the doped polysilicon layer into the floating electroconductive layer through the tunnel insulating film.

2. A semiconductor device according to claim 1 wherein the thin film single-crystalline semiconductor layer has a thickness smaller than a maximum width of a depletion layer of the channel region of the MOSFET.

3. A semiconductor device according to claim 1 wherein the floating electroconductive layer extends from an area corresponding to the source region to an area corresponding to the drain region in the insulating layer, a distance from the thin film single-crystalline semiconductor layer to the floating electroconductive layer being shorter in an area corresponding to the channel than in areas other than the area corresponding to the channel.

4. A semiconductor device comprising:
a semiconductor substrate;
a thin film single-crystalline semiconductor layer with a first insulating layer interposed therebetween;
a plurality of MOSFETs comprising source and drain regions in the thin film single-crystalline semiconductor layer;
a gate insulating film on the thin film single-crystalline semiconductor layer;
a polysilicon gate on the gate insulating film;
a floating electroconductive layer; and
a metal electrode layer connected to the semiconductor substrate for applying such a voltage to store electric charges in the floating electroconductive layer,
the thin film single-crystalline semiconductor layer having a channel region at a portion corresponding to the polysilicon gate, and
the floating electroconductive layer being under the first insulating layer at least at a position corresponding to the channel region of one of the plurality of MOSFETs and a second insulating layer underlying the floating electroconductive layer, the floating electroconductive layer being by the first and second insulating layers and being electrically insulated
wherein the floating electroconductive layer is common to more than one of the plurality of MOSFETs.

5. A semiconductor device according to claim 4 wherein the floating electroconductive layer has a portion where the thickness of the insulating layer between the floating electroconductive layer and the channel region in the single-crystalline layer of one of the MOSFETs is smaller than the thickness between the floating electroconductive layer and portions other the channel of the single-crystalline layer, so that said one of the MOSFETs is used to inject the electric charge into the floating electroconductive layer.

6. A semiconductor device according to claim 4 wherein the MOSFETs includes an N-channel MOSFET and a P-channel MOSFET.

7. A semiconductor device comprising:
a semiconductor substrate,
a thin film single-crystalline semiconductor layer with an insulating layer interposed therebetween,
a plurality of MOSFETs each comprising source and drain regions in the thin film single-crystalline semiconductor layer,
a gate insulating film on the thin film single-crystalline semiconductor layer, and
a polysilicon gate on the gate insulating film, and
an electrode,
the thin film single-crystalline semiconductor layer having a channel region at a portion corresponding to the polysilicon gate, the insulating layer containing a floating electroconductive layer buried therein, the floating electroconductive layer being located at least at a position corresponding to the channel region of more than one said plurality of MOSFETs and being electrically insulated, and the electrode being connected to the semiconductor substrate for applying a voltage to store electric charges in the floating electroconductive layer.

8. A semiconductor device according to claim 7 wherein the floating electroconductive layer has a portion where the thickness of the insulating layer between the floating electroconductive layer and the channel region in the single-crystalline layer of one of the MOSFETs is smaller than the thickness between the floating electroconductive layer and portions of the single-crystalline layer other than said portion, so that said one of the MOSFETs is used to inject the electric charge into the floating electroconductive layer.

9. A semiconductor device according to claim 7 wherein the MOSFETs includes an N-channel MOSFET and a P-channel MOSFET.

10. A semiconductor device comprising:

a semiconductor substrate;

a thin film single-crystalline semiconductor layer with a first insulating layer interposed therebetween;

a MOSFET comprising source and drain regions in the thin film single-crystalline semiconductor layer;

a gate insulating film on the thin film single-crystalline semiconductor layer;

a polysilicon gate on the gate insulating film;

a floating electroconductive layer;

a metal electrode layer connected to the semiconductor substrate for applying such a voltage to store electric charges in the floating electroconductive layer;

a second thin film single-crystalline semiconductor layer on the first insulating layer;

a tunnel insulating film on the second thin film single-crystalline semiconductor layer;

a doped polysilicon layer on the tunnel insulating layer and a second metal electrode layer on the doped polysilicon layer, the thin film single-crystalline semiconductor layer having a channel region at a portion corresponding to the polysilicon gate, and the floating electroconductive layer being under the first insulating layer at least at a position corresponding to the channel region of the MOSFET and a second insulating layer underlying the floating electroconductive layer, the floating electroconductive layer being buried by the first and second insulating layers and being electrically insulated, the second thin film single-crystalline semiconductor layer being insulated from the MOSFET and connected to the floating electroconductive layer, by which the electric charge is introduced in the floating electroconductive layer by applying a voltage between the metal electrode layer and the second metal layer so that the electric charge is injected from the doped polysilicon layer into the floating electroconductive layer through the tunnel insulating film.

* * * * *